(12) United States Patent
Yun et al.

(10) Patent No.: US 9,025,132 B2
(45) Date of Patent: May 5, 2015

(54) DIGITAL EXPOSURE APPARATUS AND METHOD OF EXPOSING A SUBSTRATE USING THE SAME

(75) Inventors: Sang-Hyun Yun, Suwon-si (KR); Cha-Dong Kim, Hwaseong-si (KR); Jung-In Park, Seoul (KR); Su-Yeon Sim, Changwon-si (KR); Hi-Kuk Lee, Yongin-si (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 572 days.

(21) Appl. No.: 13/406,828

(22) Filed: Feb. 28, 2012

(65) Prior Publication Data
US 2013/0016330 A1 Jan. 17, 2013

(30) Foreign Application Priority Data
Jul. 12, 2011 (KR) .................. 10-2011-0068680

(51) Int. Cl.
G03B 27/54 (2006.01)
G03B 27/42 (2006.01)
G03F 7/20 (2006.01)

(52) U.S. Cl.
CPC .................. *G03F 7/70275* (2013.01)

(58) Field of Classification Search
CPC .................................. G03F 7/70275
USPC ............... 355/52, 53, 55, 67–71; 250/492.1, 250/492.2
See application file for complete search history.

(56) References Cited

U.S. PATENT DOCUMENTS 8,531,648 B2 * 9/2013 De Jager et al. ............ 355/55
2002/0171047 A1 * 11/2002 Chan et al. ............ 250/492.1

* cited by examiner

*Primary Examiner* — Hung Henry Nguyen
(74) *Attorney, Agent, or Firm* — F. Chau & Associates, LLC (57) ABSTRACT

A digital exposure apparatus includes a displaceable stage, a light source part, a digital micro mirror part and a micro lens part. A substrate is disposed on the stage. The light source part generates a first light. The digital micro mirror part is disposed over the stage. The digital micro mirror part includes a plurality of digital micro mirrors. The digital micro mirror converts the first light into one or more second light beams. The micro lens part is disposed between the stage and the digital micro mirror part and includes a plurality of micro lenses. The micro lenses convert the one or more second light beams into one or more third light beams which are irradiated upon the substrate. The third light has an oval cross sectional shape.

18 Claims, 5 Drawing Sheets

DIGITAL EXPOSURE APPARATUS AND METHOD OF EXPOSING A SUBSTRATE USING THE SAME

This application claims priority under 35 U.S.C. §119 from Korean Patent Application No. 2011-0068680, filed on Jul. 12, 2011 in the Korean Intellectual Property Office, the contents of which are herein incorporated by reference in their entirety.

BACKGROUND

1. Technical Field

Exemplary embodiments of the present disclosure are directed to a digital exposure apparatus and a method of exposing a substrate using the digital exposure apparatus. More particularly, exemplary embodiments of the present disclosure are directed to a digital exposure apparatus improving an accuracy of a pattern and a method of exposing a substrate using the digital exposure apparatus.

2. Description of the Related Art

In general, to form a metal pattern including signal lines and a thin film transistor ("TFT") which is a switching element of a display substrate, a metal layer and a photoresist layer are sequentially formed, and a mask corresponding to the metal pattern is disposed on the photoresist layer.

Then, light is irradiated upon an upper surface of the mask so that the photoresist layer may be exposed and developed. Thus, a photoresist pattern corresponding to the mask may be formed. The metal layer may be etched to form the metal pattern. When the metal layer is etched, the photoresist pattern functions as an etch stopping layer.

When a display substrate has a plurality of differently shaped metal patterns, a plurality of masks corresponding to the number of the metal patterns is required. In addition, if the shape of the metal pattern is changed, the shape of the mask should change correspondingly so that a new mask may be fabricated. Since the fabrication cost of a mask is relatively high, the manufacturing cost of the display substrate may increase.

Alternatively, a digital exposing apparatus providing a plurality of beams to a substrate without the mask may be used. In a digital exposing apparatus, beams may be independently turned on or off to selectively provide beams to the substrate. Thus, a desired photoresist pattern may be formed on the substrate.

An area on which the light from the digital exposing apparatus is incident is quite limited, so that either the digital exposing apparatus or the substrate needs to be displaced to form the photoresist pattern on a large-size substrate. To improve productivity of the substrate, the digital exposing apparatus or substrate may be displaced at a relatively high speed.

A cross-sectional shape of the beam provided to the substrate is ideally a circle. However, when the substrate is displaced at a relatively high speed, the cross-sectional shape of the beam may be distorted, decreasing the accuracy of the pattern.

SUMMARY

Exemplary embodiments of the present disclosure provide a digital exposure apparatus capable of improving an accuracy of a pattern.

Exemplary embodiments of the present disclosure also provide a method of exposing substrate using the digital exposure apparatus.

In an exemplary digital exposure apparatus according to the present disclosure, the digital exposure apparatus includes a stage, a light source part, a digital micro mirror part and a micro lens part. A substrate is disposed on the stage. The light source part generates a first light. The digital micro mirror part is disposed over the stage. The digital micro mirror part includes a plurality of digital micro mirrors. The digital micro mirror converts the first light into one or more beams of a second light. The micro lens part is disposed between the stage and the digital micro mirror part and includes a plurality of micro lenses. The micro lens converts a beam of second light into a beam of third light having an oval cross sectional shape. The third light is irradiated upon the substrate.

In the exemplary embodiment, each micro lens may have an oval shape. The oval shape of the micro lens may have a longer axis and a shorter axis. The stage may be adapted to being displaced. The shorter axis may be substantially parallel to a displacement direction of the substrate.

In the exemplary embodiment, a length of the shorter axis may be a difference between a length of the longer axis and a compensating value.

In the exemplary embodiment, the compensating value may increase as a displacement speed of the substrate increases.

In the exemplary embodiment, an energy distribution of a third light beam may be determined as:

$$E(x, y, t, v_y, FWHM_x, I_0) = I_0 \frac{\sqrt{2\pi} \cdot FWHM_x}{4\sqrt{2\ln 2} \cdot v_y} \times$$
$$\exp\left(-4\ln 2 \left(\frac{x}{FWHM_x}\right)^2\right) \times \left\{ \text{erf}\left(\sqrt{4\ln 2} \left(\frac{v_y \cdot t - y}{FWHM_x}\right)\right) + \text{erf}\left(\frac{\sqrt{4\ln 2} \cdot y}{FWHM_x}\right) \right\}.$$

x may be a position in a direction substantially perpendicular to the displacement direction of the substrate, y may be a position in a direction substantially parallel to the displacement direction of the substrate, t may be a displacement duration of the substrate, $v_y$ may be the displacement speed of the substrate, $FWHM_x$ may be a width corresponding to a half of a maximum energy of a third light beam in the x direction, $I_0$ may be a maximum intensity of a third light beam. The compensating value may be based on a difference between the energy distribution of a third light beam in the y direction and the energy distribution of a third light beam in the x direction.

In the exemplary embodiment, the number of the digital micro mirrors may be substantially equal to the number of the micro lenses.

In the exemplary embodiment, the digital micro mirror part may be inclined with respect to the substrate.

In the exemplary embodiment, the digital exposure apparatus may further include a first lens disposed between the digital micro mirror part and the micro lens part. The first lens may be a magnifying lens.

In the exemplary embodiment, the digital exposure apparatus may further include a second lens disposed between the micro lens part and the stage. The second lens may be a reducing lens.

In an exemplary method of exposing a substrate according to the present disclosure, the method includes displacing a substrate, generating a first light, converting the first light into one or more second light beams using a plurality of digital micro mirrors disposed over the substrate, converting the second light beams into one or more third light beams having an oval cross sectional shape using a plurality of micro lenses disposed between the substrate and the digital micro mirrors and irradiating the third light beams upon the substrate.

In the exemplary embodiment, each of the micro lens may have an oval shape. The oval shape of the micro lens may have a longer axis and a shorter axis. The shorter axis may be substantially parallel to a displacement direction of the substrate.

In the exemplary embodiment, a length of the shorter axis may be a difference between a length of the longer axis and a compensating value.

In the exemplary embodiment, the compensating value may increase as a displacement speed of the substrate increases.

In the exemplary embodiment, an energy distribution of a third light beam may be determined as:

$$E(x, y, t, v_y, FWHM_x, I_0) = I_0 \frac{\sqrt{2\pi} \cdot FWHM_x}{4\sqrt{2\ln2} \cdot v_y} \times$$

$$\exp\left(-4\ln2\left(\frac{x}{FWHM_x}\right)^2\right) \times \left\{ \text{erf}\left(\sqrt{4\ln2}\left(\frac{v_y \cdot t - y}{FWHM_x}\right)\right) + \text{erf}\left(\frac{\sqrt{4\ln2} \cdot y}{FWHM_x}\right) \right\}.$$

x may be a position in a direction substantially perpendicular to the displacement direction of the substrate, y may be a position in a direction substantially parallel to the displacement direction of the substrate, t may be a displacement duration of the substrate, $v_y$ may be a displacement speed of the substrate, $FWHM_x$ may be a width corresponding to a half of a maximum energy of a third light beam in the x direction, $I_0$ may be a maximum intensity of a third light beam. The compensating value may be based on a difference between the energy distribution of a third light beam in the y direction and the energy distribution of a third light beam in the x direction.

In the exemplary embodiment, the number of the digital micro mirrors may be substantially equal to the number of the micro lenses.

In the exemplary embodiment, the digital micro mirrors may be inclined with respect to the substrate.

In an exemplary digital exposure apparatus according to the present disclosure, the digital exposure apparatus includes a digital micro mirror part and a micro lens part. The digital micro mirror part may include a plurality of digital micro mirrors that convert a first light into one or more beams of a second light. The micro lens part may be disposed below the digital micro mirror part and may include a plurality of oval shaped micro lenses. Each micro lens converts a beam of second light into a beam of third light having an oval cross sectional shape which is irradiated upon a displaceable substrate. A shorter axis of an oval shaped micro lens may be substantially parallel to a displacement direction of the substrate. A length of the shorter axis may decrease as a displacement speed of the substrate increases.

In an exemplary embodiment, the digital exposure apparatus further includes a light source part that generates the first light, and a displaceable stage upon which the substrate is disposed. The digital micro mirror part may be disposed over the stage, and the micro lens part may be disposed between the stage and the digital micro mirror part.

In an exemplary embodiment, the oval shaped micro lens may have a longer axis substantially perpendicular to the shorter axis, and a length of the shorter axis may be a difference between a length of the longer axis and a compensating value. The compensating value may increases as a displacement speed of the substrate increases In an exemplary embodiment, an energy distribution of a third light beam may be determined as:

$$E(x, y, t, v_y, FWHM_x, I_0) = I_0 \frac{\sqrt{2\pi} \cdot FWHM_x}{4\sqrt{2\ln2} \cdot v_y} \times$$

$$\exp\left(-4\ln2\left(\frac{x}{FWHM_x}\right)^2\right) \times \left\{ \text{erf}\left(\sqrt{4\ln2}\left(\frac{v_y \cdot t - y}{FWHM_x}\right)\right) + \text{erf}\left(\frac{\sqrt{4\ln2} \cdot y}{FWHM_x}\right) \right\}.$$

x may be a position in a direction substantially perpendicular to the displacement direction of the substrate, y may a position in a direction substantially parallel to the displacement direction of the substrate, t may be a displacement duration of the substrate, $v_y$ may be a displacement speed of the substrate, $FWHM_x$ may be a width corresponding to a half of a maximum energy of a third light beam in the x direction, and $I_0$ may a maximum intensity of the third light. The compensating value may be based on a difference between the energy distribution of a third light beam in the y direction and the energy distribution of a third light beam in the x direction.

According to a digital exposure apparatus and a method of exposing a substrate using the digital exposure apparatus, a shape of a micro lens may change so that light irradiated upon a substrate may have a circular cross sectional shape. Thus, an accuracy of a pattern formed on the substrate may be improved.

DETAILED DESCRIPTION OF EXEMPLARY EMBODIMENTS

Hereinafter, exemplary embodiments of the present disclosure will be explained in detail with reference to the accompanying drawings.

Figure 1:
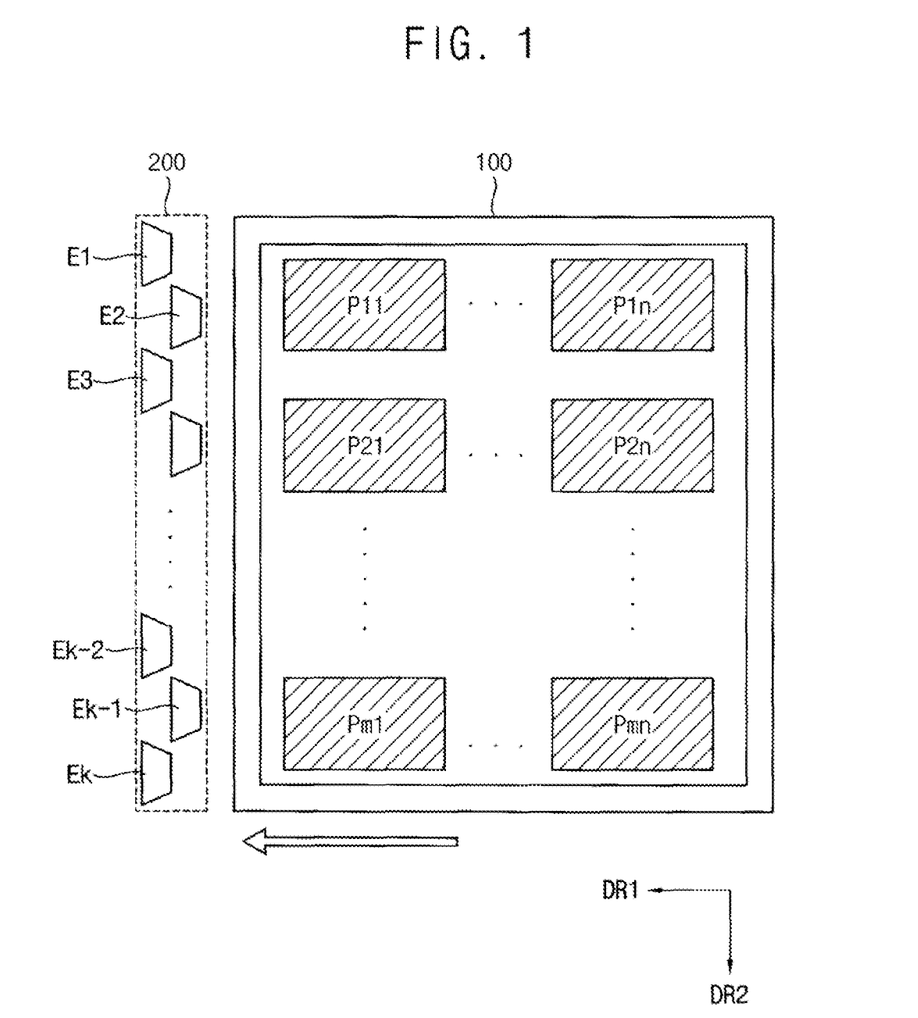
FIG. 1 is a plan view illustrating a digital exposure apparatus according to an exemplary embodiment of the present disclosure.
Figure 2:
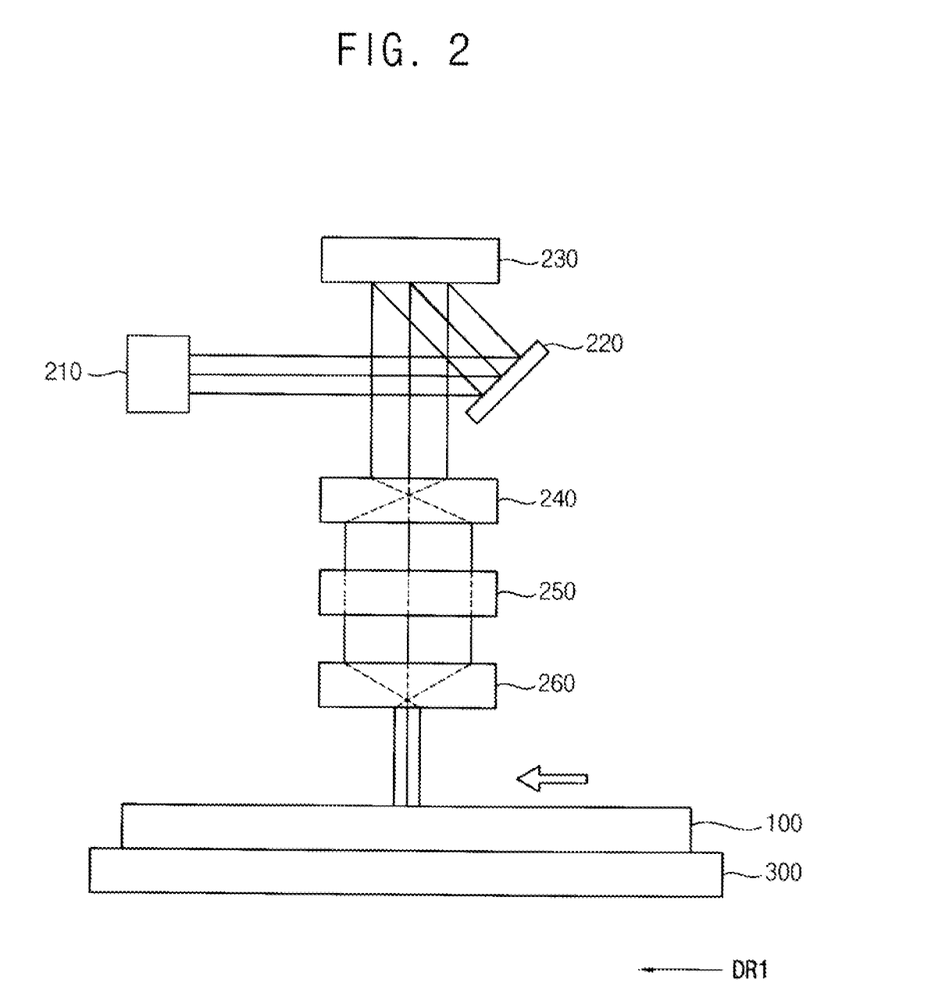
FIG. 2 is a cross-sectional view illustrating the digital exposure apparatus of FIG. 1.

FIG. 1 is a plan view illustrating a digital exposure apparatus according to an exemplary embodiment of the present disclosure. FIG. 2 is a cross-sectional view illustrating the digital exposure apparatus of FIG. 1.

Referring to FIGS. 1 and 2, the digital exposure apparatus includes an exposure part 200 and a stage 300 transferring a substrate 100.

The substrate 100 is transferred along a first direction DR1 under the exposure part 200. The substrate 100 is transferred to the exposure part 200 by the stage 300 disposed under the substrate 100.

The substrate 100 may be a mother substrate for forming a plurality of display panels. The substrate 100 may include a plurality of panel areas P11, P21, . . . , Pmn disposed in a matrix pattern. Herein, m and n are natural numbers.

The substrate 100 may include a glass ID portion (not shown) having an identification number of the substrate 100 and a plurality of cell ID portions (not shown) having identification numbers for each of the panels P11, P21, . . . , Pmn.

A photosensitive film (not shown) may be formed on the substrate 100. The photosensitive film may be used to form a mask for forming a pattern on the substrate 100. The photosensitive film may include a photosensitive resin such as a photosensitive epoxy resin coated on a surface of the substrate 100.

The substrate 100 may be exposed by a step type exposure or a scan type exposure. In a step type exposure, the stage 300 may discontinuously displace the substrate 100 with repetitive discrete displacements. In a scan type exposure, the stage 300 may continuously displace the substrate 100. When an island pattern is formed on the substrate 100, a step type exposure may be used. When a strip pattern is formed on the substrate 100, a scan type exposure may be used.

The exposure part 200 may include a plurality of exposure heads E1, E2, . . . , Ek. The exposure heads E1, E2, . . . , Ek are disposed along a second direction DR2 substantially perpendicular to the first direction DR1. Herein, k is a natural number.

For example, the exposure heads E1, E2, . . . , Ek may be disposed in two columns. The exposure heads disposed in a first column alternate with the exposure heads disposed in a second column. Alternatively, the exposure heads disposed in the first column may overlap with the exposure heads disposed in the second column. These arrangements are exemplary and non-limiting. Although not shown in figures, the exposure heads E1, E2, . . . , Ek may be disposed in various other arrangements along the second direction DR2.

The exposure part 200 exposes the substrate 100 displaced in the first direction DR1 so that an exposure pattern is formed on the substrate 100 along a direction opposite to the first direction DR1.

Referring to FIG. 2, each exposure head includes a light source part 210, a mirror 220, a digital micro mirror part 230 and a micro lens part 250. The exposure head may further include a first lens 240 and a second lens 260.

The light source part 210 generates a first light. The first light propagates to the mirror 220. The light source part 210 may continuously generate the first light. The light source part 210 may include a light generating part (not shown), a light diffusing part (not shown), a filtering part (not shown) and a collimator (not shown). The first light may be ultraviolet light which causes a reaction on the photosensitive film.

The mirror 220 changes the direction of the first light, so that the first light propagates to the digital micro mirror part 230. The mirror 220 is inclined with respect to the propagation direction of the first light.

The digital micro mirror part 230 receives the first light from the mirror 220. The digital micro mirror part 230 converts the first light into a plurality of second light beams, and irradiates the second light beams in a direction substantially perpendicular to the substrate 100. The second light beams may have circular shaped cross-sections.

The digital micro mirror part 230 may include a plurality of digital micro mirrors. The shape and operation of the digital micro mirror part 230 will be explained in detail with reference to FIG. 3.

The micro lens part 250 receives the second light beams from the digital micro mirror part 230. The micro lens part 250 may convert the second light beams into a plurality of third light beams having oval shaped cross-sections. The micro lens part 250 irradiates the third light beams in a direction substantially perpendicular to the substrate 100.

The micro lens part 250 may include a plurality of micro lenses. The shape and operation of the micro lens part 250 will be explained in detail with reference to FIGS. 5 and 6.

The first lens 240 may be disposed between the digital micro mirror part 230 and the micro lens part 250. The first lens 240 may be a magnifying lens.

For example, the first lens 240 may be a 1:3 magnifying lens having a relatively small aperture. Thus, when the second light beams pass through the first lens 240, the cross sectional spread of the second light beams may be increased three times.

The second light beams passing through the first lens 240 may be focused to a focal point at which the second light beams cross each other.

When the exposure head includes the first lens 240, the micro lens part 250 may receive the second light beams from the first lens 240. Alternatively, the exposure head may omit the first lens 240.

The second lens 260 may be disposed between the micro lens part 250 and the stage 300. The second lens 260 may be a reducing lens decreasing a cross sectional spread of the third light beams.

For example, the second lens 260 may be a 5:1 reducing lens having a relatively high aperture. Thus, when the third light beams pass through the second lens 260, the cross sectional spread of the third light beams may be decreased five times.

The third light beams passing through the second lens 260 may be focused to a focal point at which the third light beams cross each other.

When the exposure head includes the second lens 260, the substrate 100 may receive the third light beams from the second lens 260. Alternatively, the exposure head may omit the second lens 260.

Figure 3:
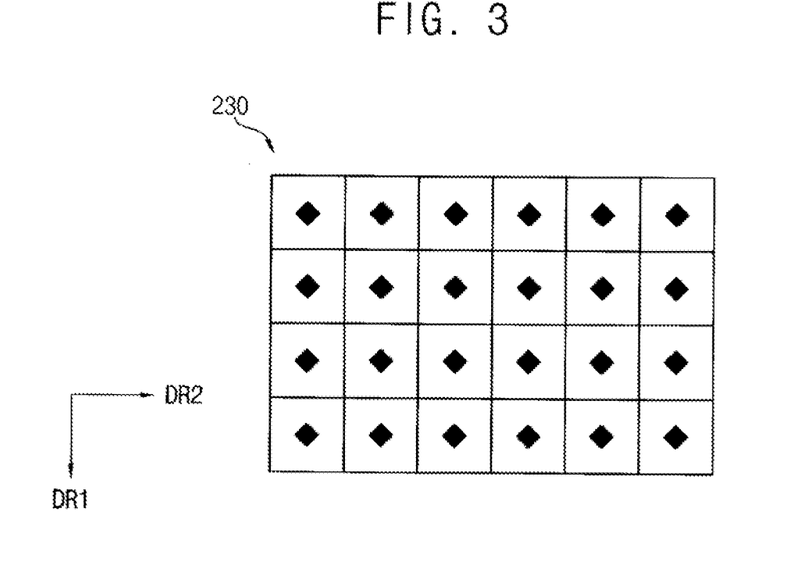
FIG. 3 is a plan view illustrating a digital micro mirror part of FIG. 2.

FIG. 3 is a plan view illustrating the digital micro mirror part 230 of FIG. 2.

Referring to FIGS. 1 to 3, the digital micro mirror part 230 includes a plurality of the digital micro mirrors. The digital micro mirrors convert the first light into the plurality of the second light beams.

The digital micro mirrors are disposed in a matrix pattern. The number of the digital micro mirrors is not limited to that shown in FIG. 3, and may be greater than or less than the number shown in FIG. 3.

Each of the digital micro mirrors may have a rectangular shape. For example, each of the digital micro mirrors may have a square shape.

The digital micro mirror part 230 may selectively convert the first light into the second light beams based on pattern data of the substrate 100.

The digital micro mirror part 230 is connected to a digital micro mirror controller (not shown). The digital micro mirror controller respectively outputs control signals controlling on/off states of the digital micro mirrors to the digital micro mirrors based on the pattern data.

When the control signal of an individual digital micro mirror has an on state, the digital micro mirror converts the first light into a beam of the second light and irradiates the second light beam to the substrate 100.

When the control signal of an individual digital micro mirror has an off state, the digital micro mirror does not convert the first light into the second light and does not irradiate a beam of the second light to the substrate 100.

The number of second light beams may be less than or equal to the number of the digital micro mirrors. For example, when the control signals of all of the digital micro mirrors have the on states, the number of the second light beams is equal to the number of the digital micro mirrors.

According to the control signal of the digital micro mirror, an angle of the digital micro mirror may be adjusted. For example, when the control signal of the digital micro mirror has an on state, the digital micro mirror may be inclined by +12 degrees with respect to a reference angle. When the control signal of the digital micro mirror has an off state, the digital micro mirror may be inclined by −12 degrees with respect to the reference angle.

The digital micro mirror controller may be connected to a central portion of each of the digital micro mirrors.

Each of the second light beams irradiated to the substrate 100 by the digital micro mirror part 230 and the micro lens part 250 has a dot shape. The light beams are discontinuously distributed on the substrate 100 with gaps separating the beams so that not all of the substrate 100 may be irradiated by the light beams. Thus, no line patterns or plane patterns may be formed using a digital exposure apparatus of the present exemplary embodiment. For example, no line pattern extending along the second direction DR2 perpendicular to a moving direction of the substrate 100, may be formed using a digital exposure apparatus of the present exemplary embodiment.

The digital micro mirror part 230 may be inclined with respect to the substrate 100. When the digital micro mirror part 230 is inclined with respect to the substrate 100, gaps between the light beams irradiated to the substrate 100 may be adjusted. Thus, a line pattern or a plane pattern may be formed using a digital exposure apparatus of the present exemplary embodiment.

Figure 4:
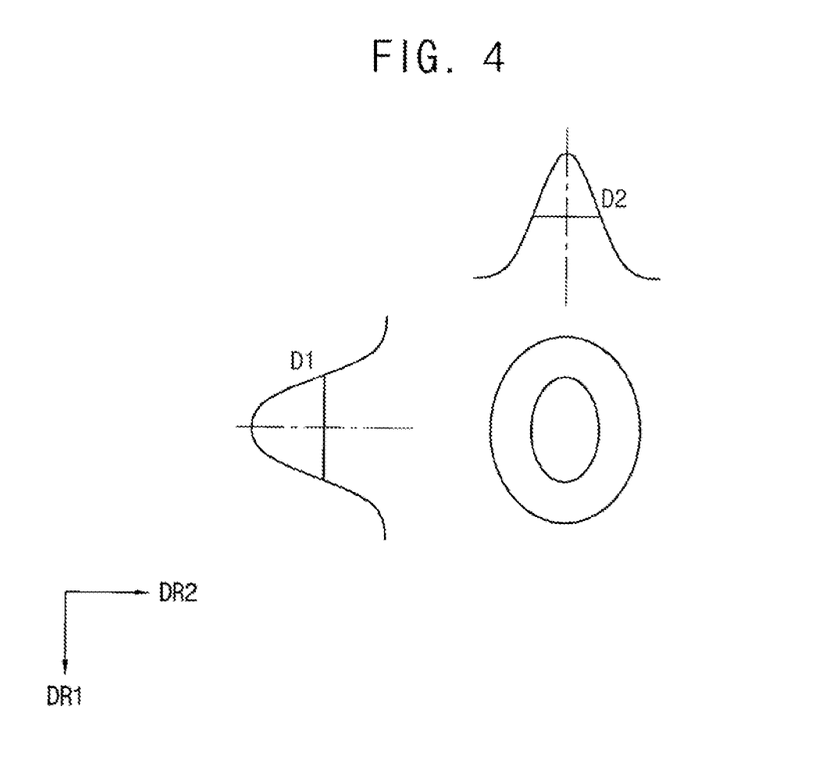
FIG. 4 illustrates an energy distribution of a third light beam upon a substrate of FIG. 1 when a circular shaped micro lens is used.

FIG. 4 illustrates an energy distribution of a third light beam upon the substrate 100 of FIG. 1 when a circular shaped micro lens is used.

Referring to FIGS. 1 to 4, the micro lens part 250 includes a plurality of the micro lenses. When the micro lens has a circular shape, the third light beams may have a circular cross sectional shape.

However, when the substrate 100 is displaced, the illumination patterns of the third light beams on the substrate 100 may be distorted with respect to the cross sectional patterns of the third light beams themselves.

The third light beam patterns on the substrate 100 may have an oval shape having a longer axis in the first direction DR1 and a shorter axis in the second direction DR2. The shorter axis may be substantially same as a radius of a third light beam cross section itself. The longer axis may be longer than the radius of a third light beam cross section.

As shown in FIG. 4, a first width D1 is greater than a second width D2, where the first width D1 corresponds to an energy which is a half of the maximum energy of a third light beam in the first direction DR1 and the second width D2 corresponds to an energy which is a half of the maximum energy of the third light beam in the second direction DR2.

As a displacement speed of the substrate 100 increases, the distortion of the third light beam illumination patterns increases. For example, the longer axis of a third light beam cross sectional pattern on the substrate 100 may increase.

The third light beam cross section patterns on the substrate 100 should have a circular shape. When the third light beam cross sectional patterns have an oval shape on the substrate 100, an accuracy of a pattern formed on the substrate 100 may be reduced. For example, an edge of the pattern may be blurry, and a boundary between an area where the pattern is formed and an area where the pattern is not formed may be indistinct.

More particularly, when the first substrate 100 is displaced in the first direction DR1, an edge of the pattern extending in the second direction DR2 may become blurred, and a boundary extending in the first direction DR1 between an area where the pattern is formed and an area where the pattern is not formed may become indistinct.

As a displacement speed of the substrate 100 increases, the accuracy of the pattern may decrease.

Figure 5:
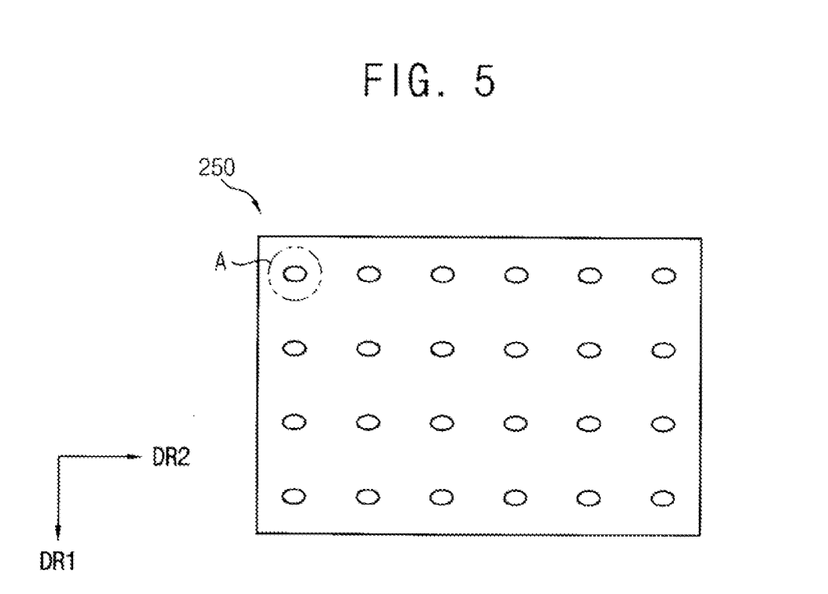
FIG. 5 is a plan view illustrating a micro lens part of FIG. 2.
Figure 6:
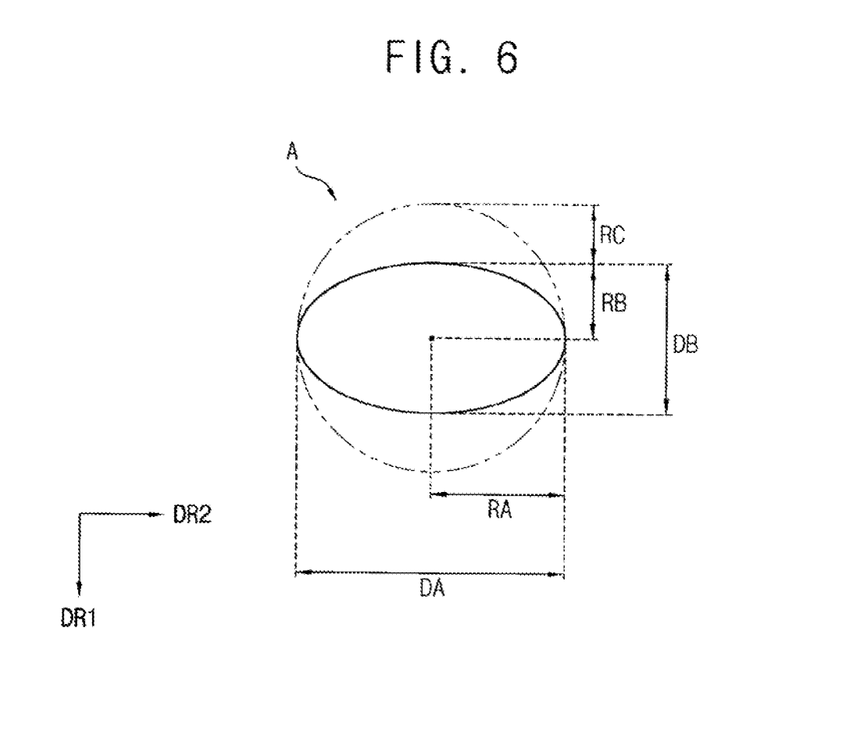
FIG. 6 is an enlarged plan view illustrating a portion 'A' of FIG. 5.

FIG. 5 is a plan view illustrating the micro lens part 250 of FIG. 2. FIG. 6 is an enlarged plan view illustrating a portion 'A' of FIG. 5.

Referring to FIGS. 1 to 3, 5 and 6, the micro lens part 250 includes a plurality of the micro lenses. The micro lenses convert one or more second light beams into one or more third light beams.

The micro lenses are disposed in a matrix pattern. The number of micro lenses is substantially equal to the number of digital micro mirrors.

Each of the micro lenses has an oval shape. Each micro lens has a longer axis in the second direction DR2 and a shorter axis in the first direction DR1. The shorter axis of the micro lens is substantially parallel to a displacement direction of the substrate 100.

The lengths of the longer axis and the shorter axis of the micro lens may be determined using a circular shaped micro lens having a radius of RA. When the circular micro lens has a radius of RA, a length of the longer axis DA of the micro lens may be twice that of RA. The length of the shorter axis of the micro lens may determined by subtracting a compensating value RC from RA. A length of the shorter axis DB of the micro lens may be a twice of RA-RC.

As a displacement speed of the substrate 100 increases, the compensating value RC increases. Accordingly, as the displacement speed of the substrate 100 increases, the length of the shorter axis DB of the micro lens decreases. However, the length of the longer axis DA of the micro lens may be unchanged according to the moving speed of the substrate 100.

An energy distribution of a third light beam on the substrate 100 may be determined from Equation 1:

$$E(x, y, t, v_y, FWHM_x, I_0) = \\ I_0 \frac{\sqrt{2\pi} \cdot FWHM_x}{4\sqrt{2\ln2} \cdot v_y} \times \exp\left(-4\ln2\left(\frac{x}{FWHM_x}\right)^2\right) \times \\ \left\{\text{erf}\left(\sqrt{4\ln2}\left(\frac{v_y \cdot t - y}{FWHM_x}\right)\right) + \text{erf}\left(\frac{\sqrt{4\ln2} \cdot y}{FWHM_x}\right)\right\}$$ [Equation 1]

Herein, x is a position in the second direction DR2 perpendicular to the displacement direction of the substrate 100, y is a position in the first direction DR1 parallel to the displacement direction of the substrate 100, t is a displacement duration of the substrate 100, $v_y$ is the displacement speed of the substrate 100, $FWHM_x$ is a width corresponding to an energy which is half of the maximum energy of a third light beam in an x direction (the second direction DR2). $FHWM_x$ corresponds to D2 in FIG. 4. $I_0$ is an intensity of the third light.

The energy distribution of a third light beam may be determined by a parameter related to the intensity of a third light beam, a parameter related to the energy distribution of a third light beam in the x direction DR2 and a parameter related to the energy distribution of a third light beam in the y direction DR1.

The compensating value RC may be determined based on a difference between the energy distribution of a third light beam in the y direction DR1 and the energy distribution of a third light beam in the x direction DR2. Referring to FIG. 4, the distortion of a third light beam is determined by the difference between the width D1 of the energy distribution of a third light beam in the y direction DR1 and the width D2 of the energy distribution of a third light beam in the x direction DR2. The compensating value RC may be set proportional to D1-D2. For example, the compensating value RC may be set to half of D1-D2.

For example, when a width increases in the first direction DR1 of a third light beam is 0.040 um, the compensating value RC may be set to 0.020 um. When a width increase in the first direction DR1 of a third light beam is 0.160 um, the compensating value RC may be set to 0.080 um.

Figure 7:
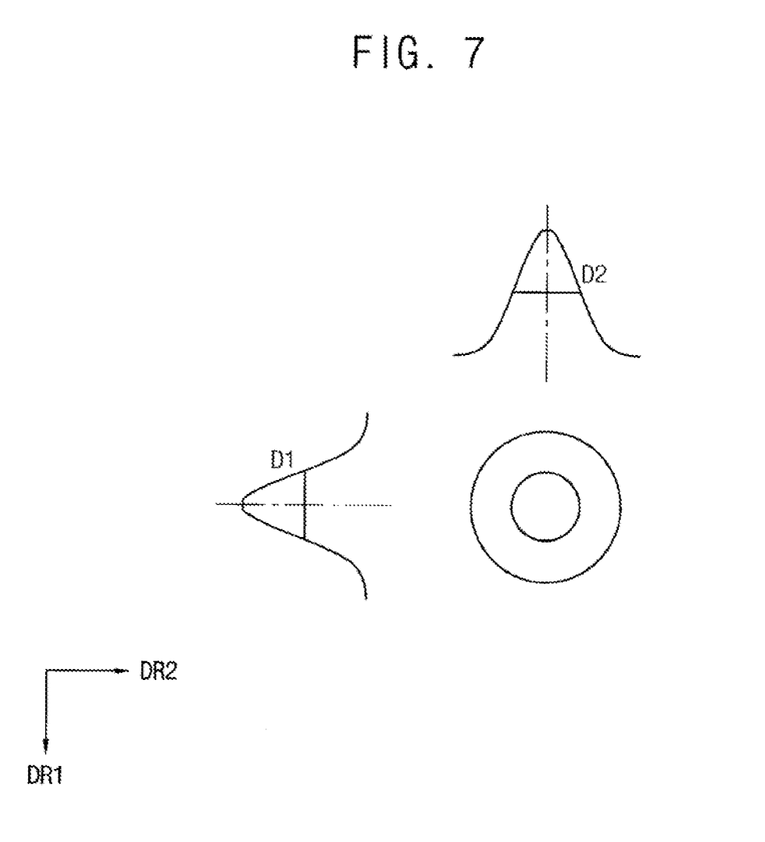
FIG. 7 illustrates an energy distribution of a third light beam upon the substrate of FIG. 1 when a micro lens of FIG. 6 is used.

FIG. 7 illustrates an energy distribution of a third light beam upon the substrate 100 of FIG. 1 when the micro lens of FIG. 6 is used.

Referring to FIGS. 5 to 7, the micro lens part 250 includes a plurality of the micro lenses. The micro lens has an oval shape having the longer axis in the first direction DR1 and the shorter axis in the second direction DR2.

The third light beams generated by the micro lens have an oval shape cross section that correspond to the shape of the micro lens, with a longer axis in the first direction DR1 and a shorter axis in the second direction DR2.

The length of the shorter axis DB is determined based on the distortion of the third light beams due to the displacement speed of the substrate 100. Thus, the third light beams irradiated upon the substrate 100 may be adjusted to have a substantially circular shape on the substrate 100. The first width D1 corresponding to half of the maximum energy of a third light beam in the first direction DR1 may be adjusted to be substantially equal to the second width D2 corresponding to half of the maximum energy of a third light beam in the second direction DR2 on the substrate 100.

According to a present exemplary embodiment, the third light beams irradiated upon the moving substrate 100 have a substantially circular shape on the moving substrate 100 so that the edge of the pattern may be smooth, and a boundary between an area where the pattern is formed and an area where the pattern is not formed may be distinct. Thus, an accuracy of the pattern formed on the substrate 100 may be improved.

According to a present disclosure as explained above, the shape of the micro lens is determined based to the displacement speed of the substrate so that light beams irradiated upon the moving substrate may have a substantially circular cross sectional shape on the substrate. Thus, an accuracy of the pattern formed on the substrate may be improved.

In addition, a process margin of the substrate may be improved, thus improving a productivity of the display panel. Improving an accuracy of the pattern may improve display quality.

The foregoing is illustrative of the present disclosure and is not to be construed as limiting thereof. Although a few exemplary embodiments of the present disclosure have been described, those skilled in the art will readily appreciate that many modifications are possible in the exemplary embodiments without materially departing from the novel teachings of the present disclosure. Therefore, it is to be understood that the foregoing is illustrative of the present disclosure and is not to be construed as limited to the specific exemplary embodiments disclosed, and that modifications to the disclosed exemplary embodiments, as well as other exemplary embodiments, are intended to be included within the scope of the appended claims. The present disclosure is defined by the following claims, with equivalents of the claims to be included therein.

What is claimed is:

1. A digital exposure apparatus comprising:
    a stage on which a substrate is disposed, the stage adapted to being displaced;
    a light source part generating a first light;
    a digital micro mirror part disposed over the stage and including a plurality of digital micro mirrors, the digital micro mirror converting the first light into one or more beams of a second light; and
    a micro lens part disposed between the stage and the digital micro mirror part that includes a plurality of micro lenses, each micro lens having an oval shape with a longer axis and a shorter axis wherein the shorter axis is substantially parallel to a displacement direction of the substrate, each micro lens converting a beam of second light into a beam of third light having an oval cross sectional shape which is irradiated upon the substrate.

2. The digital exposure apparatus of claim 1, wherein a length of the shorter axis is a difference between a length of the longer axis and a compensating value.

3. The digital exposure apparatus of claim 2, wherein the compensating value increases as a displacement speed of the substrate increases.

4. The digital exposure apparatus of claim 3, wherein an energy distribution of a third light beam is determined as:

$$E(x, y, t, v_y, FWHM_x, I_0) = I_0 \frac{\sqrt{2\pi} \cdot FWHM_x}{4\sqrt{2\ln 2} \cdot v_y} \times$$

$$\exp\left(-4\ln 2 \left(\frac{x}{FWHM_x}\right)^2\right) \times \left\{\mathrm{erf}\left(\sqrt{4\ln 2}\left(\frac{v_y \cdot t - y}{FWHM_x}\right)\right) + \mathrm{erf}\left(\frac{\sqrt{4\ln 2} \cdot y}{FWHM_x}\right)\right\}$$

wherein x is a position in a direction substantially perpendicular to the displacement direction of the substrate, y is a position in a direction substantially parallel to the displacement direction of the substrate, t is a displacement duration of the substrate, $v_y$ is a displacement speed of the substrate, $FWHM_x$ is a width corresponding to a half of a maximum energy of a third light beam in the x direction, and $I_0$ is a maximum intensity of the third light, and
    the compensating value is based on a difference between the energy distribution of a third light beam in the y direction and the energy distribution of a third light beam in the x direction.

5. The digital exposure apparatus of claim 1, wherein the number of the digital micro mirrors is substantially equal to the number of the micro lenses.

6. The digital exposure apparatus of claim 1, wherein the digital micro mirror part is inclined with respect to the substrate.

7. The digital exposure apparatus of claim 1, further comprising a first lens disposed between the digital micro mirror part and the micro lens part, wherein the first lens is a magnifying lens.

8. The digital exposure apparatus of claim 1, further comprising a second lens disposed between the micro lens part and the stage, wherein the second lens is a reducing lens.

9. A method of exposing a substrate, the method comprising:
    displacing a substrate;
    generating a first light;

converting the first light into a one or more second light beams using a plurality of digital micro mirrors disposed over the substrate, each of the micro lens having an oval shape with a longer axis and a shorter axis wherein the shorter axis is substantially parallel to a displacement direction of the substrate;

converting the second light beams into one or more third light beams having an oval cross sectional shape using a plurality of micro lenses disposed between the substrate and the digital micro mirrors; and irradiating the third light beams upon the substrate.

10. The method of claim 9, wherein a length of the shorter axis is a difference between a length of the longer axis and a compensating value.

11. The method of claim 10, wherein the compensating value increases as a displacement speed of the substrate increases.

12. The method of claim 11, wherein an energy distribution of a third light beam is determined as:

$$E(x, y, t, v_y, FWHM_x, I_0) = I_0 \frac{\sqrt{2\pi} \cdot FWHM_x}{4\sqrt{2\ln 2} \cdot v_y} \times$$
$$\exp\left(-4\ln 2 \left(\frac{x}{FWHM_x}\right)^2\right) \times \left\{ \text{erf}\left(\sqrt{4\ln 2} \left(\frac{v_y \cdot t - y}{FWHM_x}\right)\right) + \text{erf}\left(\frac{\sqrt{4\ln 2} \cdot y}{FWHM_x}\right) \right\}$$

wherein x is a position in a direction substantially perpendicular to the displacement direction of the substrate, y is a position in a direction substantially parallel to the displacement direction of the substrate, t is a displacement duration of the substrate, $v_y$ is a displacement speed of the substrate, $FWHM_x$ is a width corresponding to half of a maximum energy of a third light beam in the x direction, and $I_0$ is a maximum intensity of a third light beam, and the compensating value is based on a difference between the energy distribution of a third light beam in the y direction and the energy distribution of a third light beam in the x direction.

13. The method of claim 9, wherein the number of the digital micro mirrors is substantially equal to the number of the micro lenses.

14. The method of claim 9, wherein the digital micro mirrors are inclined with respect to the substrate.

15. A digital exposure apparatus comprising:
a digital micro mirror part including a plurality of digital micro mirrors, the digital micro mirror converting a first light into one or more beams of a second light;

a micro lens part disposed below the digital micro mirror part that includes a plurality of oval shaped micro lenses, each micro lens converting a beam of second light into a beam of third light having an oval cross sectional shape which is irradiated upon a displaceable substrate, wherein a shorter axis of an oval shaped micro lens is substantially parallel to a displacement direction of the substrate, wherein a length of the shorter axis decreases as a displacement speed of the substrate increases.

16. The digital exposure apparatus of claim 15, further comprising a light source part that generates the first light; and a displaceable stage upon which the substrate is disposed, wherein the digital micro mirror part is disposed over the stage, and the micro lens part is disposed between the stage and the digital micro mirror part.

17. The digital exposure apparatus of claim 15, wherein the oval shaped micro lens has a longer axis substantially perpendicular to the shorter axis, a length of the shorter axis is a difference between a length of the longer axis and a compensating value, wherein the compensating value increases as a displacement speed of the substrate increases.

18. The digital exposure apparatus of claim 17, wherein an energy distribution of a third light beam is determined as:

$$E(x, y, t, v_y, FWHM_x, I_0) = I_0 \frac{\sqrt{2\pi} \cdot FWHM_x}{4\sqrt{2\ln 2} \cdot v_y} \times$$
$$\exp\left(-4\ln 2 \left(\frac{x}{FWHM_x}\right)^2\right) \times \left\{ \text{erf}\left(\sqrt{4\ln 2} \left(\frac{v_y \cdot t - y}{FWHM_x}\right)\right) + \text{erf}\left(\frac{\sqrt{4\ln 2} \cdot y}{FWHM_x}\right) \right\}$$

wherein x is a position in a direction substantially perpendicular to the displacement direction of the substrate, y is a position in a direction substantially parallel to the displacement direction of the substrate, t is a displacement duration of the substrate, $v_y$ is a displacement speed of the substrate, $FWHM_x$ is a width corresponding to a half of a maximum energy of a third light beam in the x direction, and $I_0$ is a maximum intensity of the third light, and the compensating value is based on a difference between the energy distribution of a third light beam in the y direction and the energy distribution of a third light beam in the x direction.

* * * * *